United States Patent
Nunan et al.

(10) Patent No.: US 7,619,229 B2
(45) Date of Patent: Nov. 17, 2009

(54) TECHNIQUE FOR MATCHING PERFORMANCE OF ION IMPLANTATION DEVICES USING AN IN-SITU MASK

(75) Inventors: Peter D. Nunan, Monte Sereno, CA (US); Bret W. Adams, Newburyport, MA (US)

(73) Assignee: Varian Semiconductor Equipment Associates, Inc., Gloucester, MA (US)

(*) Notice: Subject to any disclaimer, the term of this patent is extended or adjusted under 35 U.S.C. 154(b) by 340 days.

(21) Appl. No.: 11/549,790

(22) Filed: Oct. 16, 2006

(65) Prior Publication Data

US 2008/0087844 A1 Apr. 17, 2008

(51) Int. Cl.
*A61N 5/00* (2006.01)
(52) U.S. Cl. .............. 250/492.21; 250/492.1; 250/492.2; 250/492.3
(58) Field of Classification Search .............. 250/492.1, 250/492.2, 492.21, 492.22, 492.23, 492.3
See application file for complete search history.

(56) References Cited

U.S. PATENT DOCUMENTS

| | | | |
|---|---|---|---|
| 4,276,477 A | 6/1981 | Enge | |
| 4,283,631 A | 8/1981 | Turner | |
| 4,346,301 A * | 8/1982 | Robinson et al. | 250/492.2 |
| 4,899,059 A | 2/1990 | Freytsis et al. | |
| 4,922,106 A | 5/1990 | Berrian et al. | |
| 5,350,926 A | 9/1994 | White et al. | |
| 5,763,894 A * | 6/1998 | Enichen et al. | 250/492.2 |
| 5,776,359 A | 7/1998 | Schultz et al. | |
| 5,798,528 A | 8/1998 | Butsch et al. | |
| 5,882,947 A | 3/1999 | Lin et al. | |
| 5,985,356 A | 11/1999 | Schultz et al. | |
| 6,004,617 A | 12/1999 | Schultz et al. | |
| 6,045,671 A | 4/2000 | Wu et al. | |
| 6,326,090 B1 | 12/2001 | Schultz et al. | |
| 6,346,290 B1 | 2/2002 | Schultz et al. | |
| 6,364,956 B1 | 4/2002 | Wang et al. | |
| 6,410,331 B1 | 6/2002 | Schultz et al. | |
| 6,420,179 B1 | 7/2002 | Schultz et al. | |
| 6,462,817 B1 * | 10/2002 | Strocchia-Rivera | 356/369 |
| 6,632,285 B2 | 10/2003 | Wang et al. | |
| 6,649,413 B1 | 11/2003 | Schultz et al. | |
| 6,686,205 B1 | 2/2004 | Schultz et al. | |
| 6,794,052 B2 | 9/2004 | Schultz et al. | |
| 6,830,663 B2 | 12/2004 | Wang et al. | |
| 6,864,201 B2 | 3/2005 | Schultz et al. | |
| 6,900,444 B2 * | 5/2005 | Ferrara et al. | 250/491.1 |
| 6,930,316 B2 * | 8/2005 | Nishihashi et al. | 250/492.21 |
| 6,996,550 B2 | 2/2006 | Wang et al. | |
| 7,034,091 B2 | 4/2006 | Schultz et al. | |
| 2004/0185587 A1 * | 9/2004 | Song | 438/17 |

(Continued)

*Primary Examiner*—Nikita Wells
*Assistant Examiner*—Michael J Logie

(57) ABSTRACT

A technique for matching performance of ion implantation devices using an in-situ mask. In one particular exemplary embodiment, ion implantation is performed on a portion of a substrate while the remainder is masked off. The substrate is then moved to a second implanter tool. Implantation is then performed on another portion of the same substrate using the second tool while a mask covers the remainder of the substrate, including the first portion. After the second implantation process, parametric testing may be performed on semiconductor devices manufactured on the first and second portions to determine if there is variation in one or more performance characteristics of these semiconductor devices. If variations are found, changes may be suggested to one or more operating parameters of one of the implantation tools to reduce performance variation of implanters within the fabrication facility.

18 Claims, 4 Drawing Sheets

U.S. PATENT DOCUMENTS

| | | | |
|---|---|---|---|
| 2005/0090027 A1* | 4/2005 | Aghababazadeh et al. | 438/17 |
| 2005/0092939 A1* | 5/2005 | Coss et al. | 250/492.21 |
| 2005/0211924 A1* | 9/2005 | Shibata et al. | 250/492.21 |
| 2005/0239291 A1 | 10/2005 | Alba et al. | |
| 2005/0260354 A1 | 11/2005 | Singh et al. | |
| 2006/0255296 A1* | 11/2006 | Borden | 250/492.21 |
| 2006/0258128 A1 | 11/2006 | Nunan et al. | |
| 2007/0145298 A1* | 6/2007 | Freer et al. | 250/492.21 |
| 2007/0173043 A1* | 7/2007 | Lee et al. | 438/514 |
| 2007/0262271 A1* | 11/2007 | Ferrara et al. | 250/492.21 |

\* cited by examiner

TECHNIQUE FOR MATCHING PERFORMANCE OF ION IMPLANTATION DEVICES USING AN IN-SITU MASK

FIELD OF THE DISCLOSURE

The present disclosure relates generally to substrate processing techniques and more particularly, to a technique for matching performance of ion implantation devices using an in-situ mask.

BACKGROUND OF THE DISCLOSURE

In semiconductor manufacturing, ion implantation is used to change the material properties of portions of a substrate. Indeed, ion implantation has become a standard technique for altering properties of semiconductor wafers during the production of various semiconductor-based products. Implantation may be used to introduce conductivity-altering impurities, modifying crystal surfaces (pre-amorphization), to created buried layers (halo implants) to create gettering sites for contaminants, to create diffusion barriers (F and C implant. Also, implantation may be used in semiconductors for non-transistor applications such as for alloying metal contact area, in flat panel display manufacturing and surface treatment. All of these ion implantation applications may be classified generally as forming a region of material property modification.

In an ion implantation process, a desired impurity material is ionized in an ion source, the resulting ions are accelerated to form an ion beam of a prescribed energy, and the ion beam is directed at a surface of a target substrate, such as a semiconductor-based wafer. Energetic ions in the ion beam penetrate into bulk semiconductor material of the wafer and are embedded into a crystalline lattice of the semiconductor material to form a region of desired conductivity.

Ion implantation systems usually include an ion source for converting a gas or a solid material into a well-defined ion beam. The ion beam may be mass analyzed to eliminate undesired species, is accelerated to a desired energy, and is directed to a target area, typically a wafer of semiconductor material. The ion beam may be distributed over the target area by beam scanning, by target area movement, or by a combination of beam scanning and target area movement. The target may be set to a prescribed angle and orientation relative to the ion beam. Examples of prior art ion implanters are disclosed in U.S. Pat. No. 4,276,477 issued Jun. 30, 1981 to Enge; U.S. Pat. No. 4,283,631 issued Aug. 11, 1981 to Turner; U.S. Pat. No. 4,899,059 issued Feb. 6, 1990 to Freytsis et al.; U.S. Pat. No. 4,922,106 issued May 1, 1990 to Berrian et al.; and U.S. Pat. No. 5,350,926 issued Sep. 27, 1994 to White et al.

A semiconductor manufacturer's profitability may be directly affected by its ability to maintain high yields. A manufacturer's yield refers to a percentage of silicon wafer area that may be successfully processed into usable microelectronic devices (processors, memory cells, or other transistor-based, semiconductor components). Due to a high cost of silicon wafers and a high expense of processing equipment, it is desirable for manufacturers to maintain high yield rates. As an example, if a single wafer may support 300 devices, and each device has a wholesale value of $150, the value of a single processed wafer may be up to $45,000 if the entire usable surface area could be processed into usable devices— i.e., a yield of 100%. Typically, yields must remain above 70% in order for a manufacturer to achieve profitability or even viability, and even slight improvements in yields may translate into significant increases in profitability. In the semiconductor device manufacturing industry, due to a relatively low incremental cost of making more good, i.e., usable, products on each wafer, a primary goal is to maximize yields.

One factor that greatly affects yield is a manufacturer's process control. Therefore, it is critical to ensure that manufacturing equipment is operating consistently and at correct operating parameters. Eliminating process variations generally improves and ideally maximizes yields.

In the case of ion implantation equipment, there are typically four device parameters that a semiconductor manufacturer typically adjusts for its application: ion beam angle, ion dose, ion species, and ion energy. there are in addition to these adjustable parameters, implant equipment setting that can be adjusted, all of which impact semiconductor device performance and which may vary from implant tool to implant tool. Current techniques involve calibrating individual settings of individual implanters, making measurements of system settings, or using non-device blanket wafers. Using these techniques which focus on calibrating implanters one at a time, it is impossible to calibrate accurately. Moreover, calibrating implanters one at a time is time consuming, requires costly wafers, and is difficult to correlate to device yields.

In view of the foregoing, it would be desirable to provide a technique for reducing tool-to-tool performance variation which overcomes some or all of the above-described inadequacies and shortcomings of known systems.

SUMMARY OF THE DISCLOSURE

A technique for matching performance of ion implantation devices using an in-situ mask. In one particular exemplary embodiment, the technique may be realized as a method for reducing tool-to-tool process variation of ion implantation equipment by processing only a portion of a single wafer with a single ion implanter by masking the remaining wafer, then processing another portion of the wafer using another ion implanter, repeating using multiple ion implanters, each processing only a unique portion of the wafer and then performing parametric testing on the portions of the wafer processed with each implanter to determine if there are any performance variation in devices produced by different implanters.

According to a first aspect of this particular exemplary embodiment, a of matching performance between semiconductor manufacturing devices is provided. The method according to this aspect comprises processing a first portion of a substrate with a first device, moving the substrate from the first device to a second device, processing a second portion of the substrate with the second device, associating the first and second portions with the respective first and second devices, and comparing one or more properties of the first portion to one or more corresponding properties of the second portion.

In accordance with further aspects of this particular exemplary embodiment, an in-situ method of matching ion implantation tool performance is provided. The method according to this aspect comprises performing ion implantation on a first portion of a substrate using a first ion implanter, wherein a first mask is applied to the substrate having a first aperture exposing the first portion, performing ion implantation on a second portion of the substrate using a second ion implanter, wherein a second mask is applied to the substrate having a second aperture exposing the second portion, measuring at least one characteristic value of each of the first and second portions, performing a comparison of the respective characteristic values of the first and second portions, and determining at least one adjustment to an adjustable parameter of either the first or second implanter based on the comparison.

In accordance with additional aspects of this disclosure, in a semiconductor fabrication facility environment consisting of a plurality of ion implanters, a method of reducing tool-to-tool performance variation is provided. The method of reducing tool according to these additional aspects comprises applying a first mask to a semiconductor substrate, the first mask having a first aperture exposing a first portion of the substrate, performing an ion implantation process on the substrate with the first implanter, moving the substrate to a second implanter, applying a second mask to the substrate, the second mask having an second aperture exposing a second portion of the substrate, performing an ion implantation process on the substrate with the second implanter, measuring at least one characteristic value of each of the first and second portions, comparing the measured value of each of the first and second portions, and adjusting at least one adjustable operating parameter of either the first or second implanter based on the comparison.

In various embodiments this will comprise performing masking according to one or more of the methods disclosed in commonly assigned U.S. patent application Ser. No. 11/329,761 entitled "Methods and Apparatus for Enabling Multiple Process Steps on a Single Substrate," (hereinafter the '761 application) which is hereby incorporated by reference in its entirety.

In one exemplary embodiment, a masking process as described in the aforementioned '761 application may be used to run a design of experiments (DOE) on a single tool to establish the optimum parameters of the implant tool. Then, these established "master" settings can be used to match each tool to, and re-calibrate in the future to. In various embodiments, this masking process described in the '761 application is MOST effective, when trying to match MULTIPLE tools, because the cost savings is greater and complexity of alternative methods worse.

In various embodiments, this masking process may be used to select the optimum performing tool based on parametric results of devices, either to match those tools to (empirically make it the "master") or by cherry-picking the "best" tool for particular applications.

In various embodiments, this masking process can be used to check that all tools are operating within control, without optimizing as discussed in the context of FIG. 3. Rather than making assumptions, a single wafer may be run through multiple tools to assure no variation is occurring tool to tool, for "statistical process control" purposes. This method enables you to establish "normal" variation and to take action when tools begin to drift. Alternatively, this can be done without a mask, by scanning the beam electrostatically, magnetically, or moving the wafer, across only a portion of the wafer. However, this method is less effective because it is difficult if not impossible to precisely block out the regions of the wafer.

Various embodiments of the invention permit optimization of other, non-doping, non-transistor implants used in the implant process, that aren't yet in use, such as any surface modification application, any dopant application like Si implants in Ni to improve Nickel Silicidation (NiSi) process, etc.

Various embodiments of the invention permit optimization of non-semiconductor implant applications such as metal surface treatments, flat panel display applications, magneto-resistive heads used in disk drives, etc.

Various embodiments of the invention may also be applicable to applications outside of ion implantation that could similarly use a mask in front of a wafer to prevent processing of portions of the wafer, and then using the mask, exposing the different portions with different implanters, thereby enabling tool-to-tool matching. For example, it may be possible to duplicate this using photo-resist or a solid mask attached to the wafer either manually or some other method, before entering the tool and similarly exposing only a small portion of the wafer at a time.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

Figure 1:
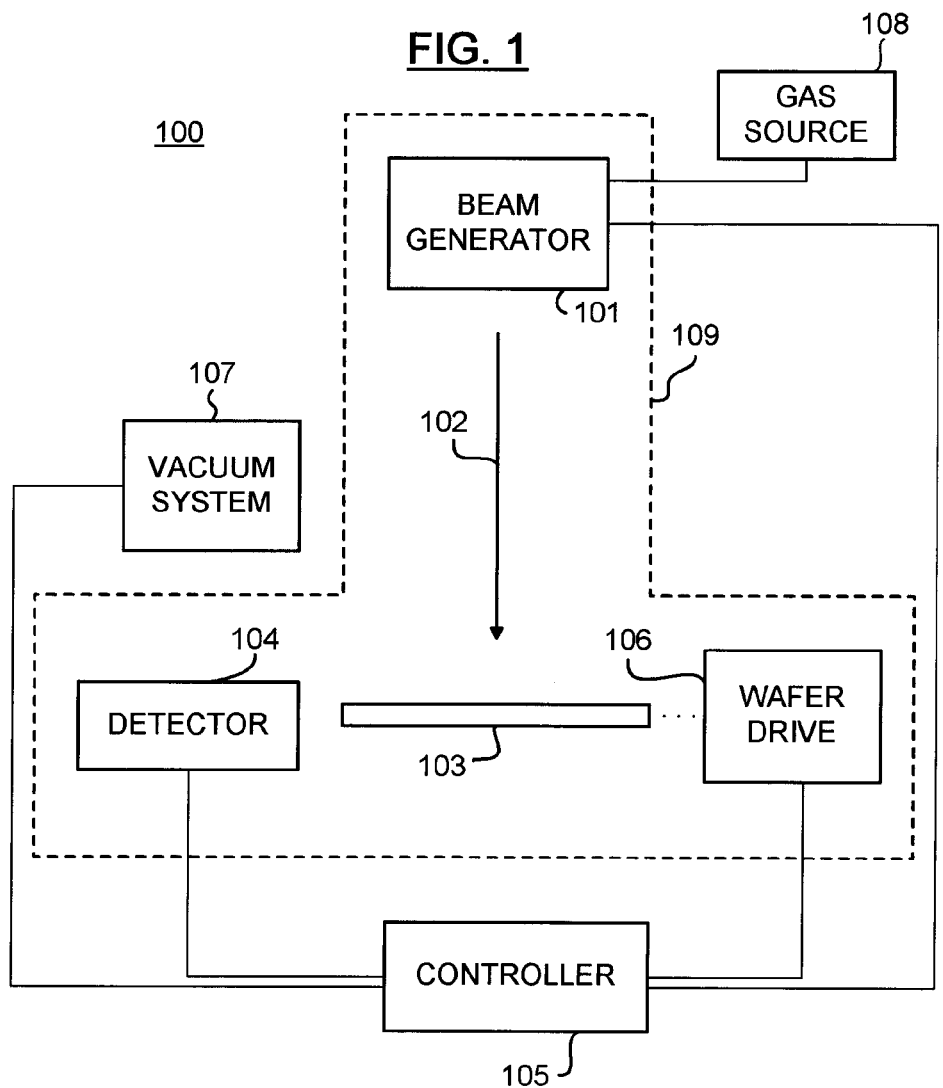
FIG. 1 is a schematic block diagram of an first ion implantation system usable with various embodiments of the present disclosure.

Referring now to FIG. 1, there is shown a schematic block diagram of an first ion implantation system 100 usable with various embodiments of the present disclosure. The ion implantation system 100 includes a beam generator 101 that generates and directs a beam 102 toward a semiconductor wafer 103. The beam generator 101 may include various different types of components and systems to generate the beam 102 such that it has desired characteristics. The beam 102 may be any type of charged particle beam, such as an energetic ion beam used to implant the semiconductor wafer 103. The semiconductor wafer 103 may take various physical shapes, such as the common circular disk shape with a flat surface geometry. The semiconductor wafer 103 may include any type of semiconductor material or any other material that is to be implanted using the beam 102. Also, though not depicted in FIG. 1, as will be discussed in greater detail in the context of FIG. 3, the system 100 may also include one or more masking devices designed to limit ion implantation to specific surface areas of the semiconductor wafer 103.

A beam current, i.e., an amount of charge carried by particles in the beam 102 to the wafer 103, may be measured by a detector 104 so as to maintain dose control. The detector 104 may be any type of device that detects a level of beam current. For example, the detector 104 may be a Faraday cup or another device that is known in the art. The detector 104 may be fixed in place or movable, and may be positioned in a variety of different ways, such as along a path of beam 102 to the wafer 103, adjacent the wafer 103 as shown in FIG. 1, behind the wafer 103, etc. Other types of devices to measure beam current, such as devices that use calorimetery or beam-induced magnetic field measurement may be used, if desired, as the detector 104.

In various embodiments, the detector 104 outputs a signal representing detected beam current to a controller 105. The controller 105 may be, or may include, a general purpose computer or network of general purpose computers programmed to perform desired input/output and other functions. In various embodiments, the controller 105 may be a data processor programmed with instruction codes for performing a semiconductor manufacturing process. In various embodiments, the controller 105 may include a power and/or data connection to various system components including the beam generator 101, detector 104, wafer drive 106, vacuum system 107 and gas source 108. The controller 105 may also include other electronic circuitry or components, such as application specific integrated circuits (e.g., ASICs), other hardwired or programmable electronic devices, discrete element circuits, field programmable gate arrays (FPGAs), etc. The controller 105 may also include devices, such as user input/output devices (keyboards, touch screens, user pointing devices, displays, printers, etc.), communication devices, data storage devices, mechanical drive systems, etc., to perform desired functions.

The controller 105 also communicates with the wafer drive 106, which is capable of moving the wafer 103 relative to the beam 102. For example, the wafer drive 106 may scan the wafer 103 across the beam 102 such that ions may be implanted on to a surface of the wafer 103. The wafer drive 106 may include various different devices or systems to physically move the wafer 103 in a desired way. For example, the wafer drive 106 may include servo drive motors, solenoids, screw drive mechanisms, one or more air bearings, position encoding devices, mechanical linkages, robotic arms, or any other components to move the wafer 103 which may be well-known in the art.

The beam 102 is transported from the beam generator 101 to the wafer 103 in a relatively high vacuum environment created in a process chamber housing 109 by the vacuum system 107. By high vacuum, it is meant that low pressure exists in the process chamber housing 109. Conversely, low vacuum refers to a relatively higher pressure in the housing 109. The vacuum in the housing 109 may be maintained using well-known systems, such as vacuum pumps, vacuum isolation valves, pressure sensors, etc. The vacuum system 107 may communicate with the controller 105, e.g., to provide information to the controller 105 regarding the current vacuum level in one or more portions of the housing 109. The vacuum system 107 may also include one or more pressure sensors that monitor pressure in the housing 109 and that communicate pressure readings to the controller 105. Alternatively, these sensors may be separate from the vacuum system 107 and in communication directly with the controller 105.

The beam 102 is shown in FIG. 1 to follow a straight path from the beam generator 101 to the wafer 103. However, as illustrated in the implantation system 200 of FIG. 2, the beam 102 may follow a curved path with one or more deflections within the generator 101 and/or between the beam generator 101 and the wafer 103. The beam 102 may be deflected, for example, by one or more magnets, lenses or other beam shaping devices.

In various embodiments of the disclosure, prior to implantation, the wafer drive 106 moves the wafer 103 away from the beam 102 so that the beam 102 is not incident on the wafer 103. The beam generator 101 may then generate a beam 102 and the detector 104 may then detect a reference level for beam current while a vacuum level within the housing 108 is maintained at a desired level and/or is stable. As one example, the vacuum level at which the reference level for the beam current is determined may be a highest vacuum level generated by the vacuum system 107 within the housing 109. Of course, the reference level for the beam current may be determined for other vacuum levels within the housing 109 as well.

In various embodiments, the detector 104 outputs a signal to the controller 105 that may be used by the controller 105 as the reference level for the beam current, or the controller 105 may process the signal to generate a reference level for the beam current. For example, the detector 104 may output an analog signal that represents a number of detected ions, and the controller 105 may convert the analog signal to a digital number that is stored within the controller 105. The stored digital number may be used as a reference level for calculating the beam current.

During implantation, the beam 102 is incident on at least a portion of the wafer 103. The beam 102 may be scanned across the wafer 103 and/or the wafer 103 may be moved across the beam 102 by the wafer drive 106, or combinations of these two may occur. For example, the beam 102 may be scanned by the beam generator 101 in one direction while the wafer 103 is moved in another direction. Movement of the beam 102 and wafer 103 may be in the same plane or in different planes.

Materials in or on the wafer 103, such as photoresist on the surface of the wafer 103, may outgas or otherwise produce materials when impacted by particles in the beam 102. This causes a vacuum fluctuation within the housing 108 that may cause the vacuum level to decrease near the wafer 103 and along the beamline. This decrease in vacuum level may cause an increase in the number of charge exchanging collisions that occur for particles in the beam 102 traveling to the wafer 103. As discussed above, the charge exchanging collisions, i.e., collisions between energetic particles in the beam 102 and materials released by out gassing or volatilization at the wafer 103, cause the charge of individual particles in the beam 102 to be changed. For example, singly positively charged ions in the beam 102 may be neutralized by collisions along the beamline, or the positively charged ions may be doubly positively charged. Although the charge of the ions may be altered, the energy of the particles is not substantially changed. Therefore, although the charge of some particles may be altered so that the detector 104 does not detect the presence of the particles, the particles may still impact the wafer 103 and contribute to the overall impurity dosing of the wafer. Thus, the detector 104 may output a signal during implantation that indicates a decrease in beam current even though the total dosing of the wafer 103 is not affected.

The controller 105 may recognize, i.e., operate based on an assumption, that the detected decrease in beam current, or a portion of a detected decrease in beam current, has been caused by vacuum fluctuations during implantation, but that the total dose implanted in the wafer 103 is not being affected. Thus, the controller 105 may detect a vacuum fluctuation based on a detected decrease in beam current. It should be understood that the beam current may vary during implantation due to other factors, such as ion source variations, and that in such cases, the controller 105 may determine that some portion of a detected beam current decrease has been caused by vacuum fluctuations, while another portion of the decrease has been caused by other factors, e.g., variations at the ion source. The controller 105 may adjust certain implantation parameters to correct for variations in beam current that are deemed to be not due to vacuum fluctuations, as is known in the. In addition, out gassing may vary with time, and the controller 105 may determine that the contribution of vacuum fluctuation to detected beam current decrease as compared to other factors may vary over time during implantation. In such cases the controller 105 may use an adjusted measured beam current that reflects only the contribution of vacuum fluctuation, and not the contribution of other factors, for purposes of controlling implantation.

The controller 105 may sense a decrease in beam current, but not necessarily adjust specific implantation parameters, such as a beam 102 scan rate, wafer 103 scan rate, etc. Instead, the controller 105 may output a signal to the vacuum system 107 indicating that a rise in vacuum pressure has been detected and that the vacuum level within the housing 108 should be adjusted accordingly. This signal to the vacuum system 107 may be provided in addition to measured vacuum level signals provided by pressure sensors to the vacuum system 107. Thus, based on the signal from the controller 105, the vacuum system 107 may begin adjusting the vacuum level within the housing 108 before a decrease in vacuum level is detected by pressure sensors associated with the vacuum system 107 thereby maintaining a stable vacuum pressure.

Alternately, the controller 105 may compare a detected beam current level provided by the detector 104 during implantation with the stored reference level for the beam current and use the difference between the two values to control either the beam 102, the wafer drive 106, or both. For example, the controller 105 may determine (based on stored information) that the decrease in beam current detected by the detector 104 during implantation is largely due to vacuum fluctuations along the beam line. Further, the controller 105 may determine that a portion of the detected decrease in beam current due to charge exchanging collisions does not affect the total dose delivered to the wafer 103, while another portion of the detected decrease in beam current does contribute to a decrease in the total dose delivered to the wafer 103. For example, some charge exchanging collisions may neutralize beam particles without affecting the particles' kinetic energy. The neutralized particles will not be detected by the detector 104, but still contribute to the total dose implanted in the wafer 103. Other collisions caused by the vacuum fluctuation may cause the charge and kinetic energy of a particle to be altered, or cause the particle to follow a trajectory that prevents the particle from being implanted in the wafer 103. These latter collisions cause a decrease in detected beam current, and also a decrease in the total dose implanted in the wafer 103. The controller 105 may scale the difference value between the detected beam current and the reference value for the beam current, so that a total dose delivered to the wafer 103 is adjusted to a desired level. The difference value may also be normalized, e.g., by dividing the difference value by the reference value. For example, the controller 105 may control the wafer drive 106 to move the wafer 103 more slowly across the beam path based on the scaled and normalized scaled reference value. The scaling factors used by the controller 105 may be determined empirically and stored in the controller 105. Thus, when a particular difference value is determined by the controller 105, a corresponding scaling factor may be retrieved and used to adjust the difference value to appropriately control the beam 102, movement of the wafer 103 or both.

Figure 2:
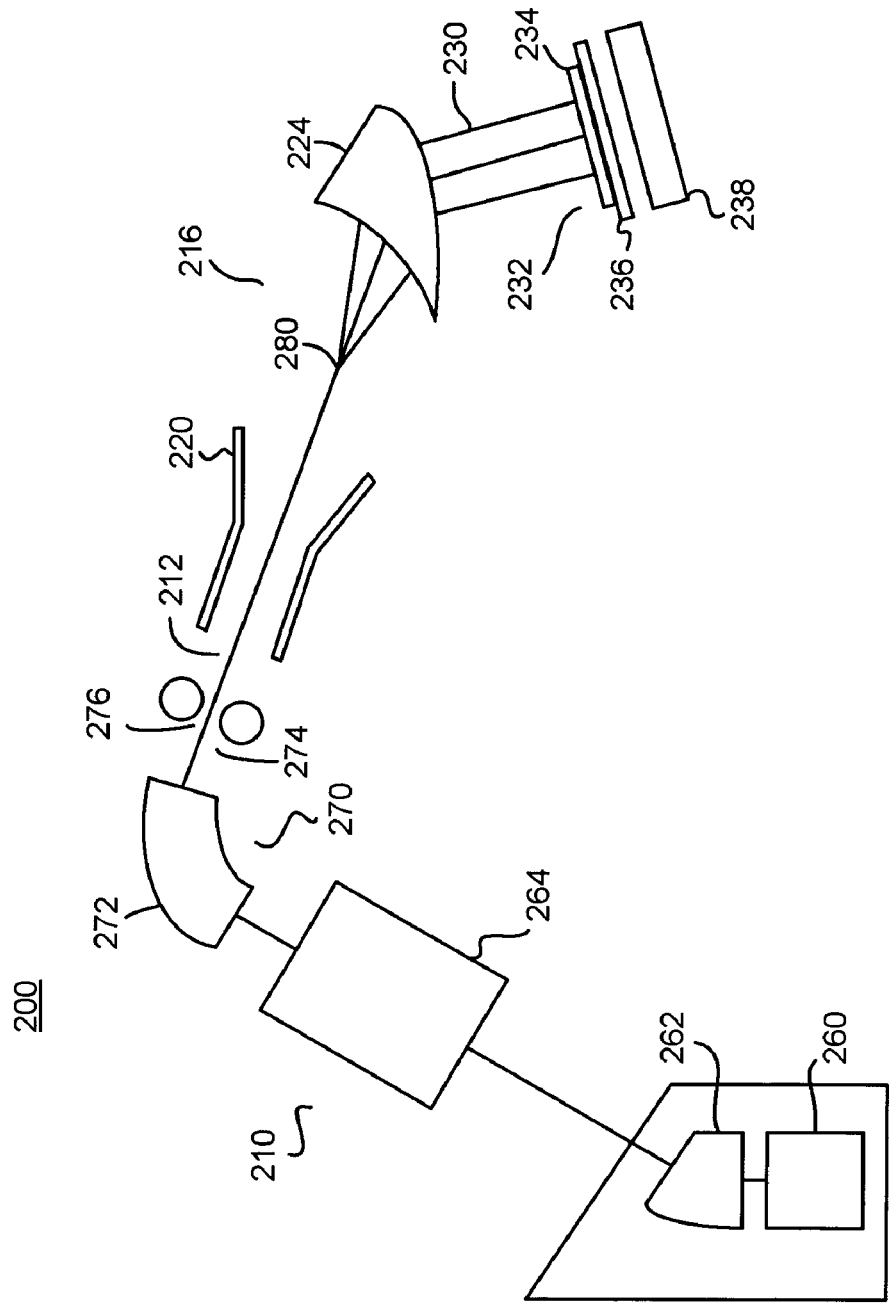
FIG. 2 is a block diagram of another ion implantation system usable with various embodiments of the present disclosure.

Referring now to FIG. 2, there is shown a block diagram of another ion implantation system usable with various embodiments of the present disclosure. The implanter system 200 of Figure, utilizing a curved ion beam, is of a different topology than that illustrated in FIG. 1. In the system of FIG. 2, an ion beam generator 210 generates an ion beam of a desired species, that is, type of gas source, accelerates ions in the ion beam to desired energies, performs mass/energy analysis of the ion beam to remove energy and mass contaminants and supplies an energetic ion beam 212 having a low level of energy and mass contaminants. A scanning system 216, which includes a scanner 220, an angle corrector 224, and a scan generator (not shown), deflects the ion beam 212 to produce a scanned ion beam 230 having parallel or nearly parallel ion trajectories.

An end station 232 includes a platen 236 that supports a semiconductor wafer 234 or other work piece in the path of scanned ion beam 230 such that ions of the desired species are implanted into the semiconductor wafer 234 thereby changing material properties of any unmasked portions. End station 232 may also include a Faraday cup 238 or other dose detector for monitoring ion beam dose and dose uniformity.

The ion beam generator 210 of FIG. 2 includes an ion beam source 260, a source filter 262, an acceleration/deceleration column 264 and a mass analyzer 270. The source filter 262 is preferably positioned in close proximity to ion beam source 260. The acceleration/deceleration column 264 is positioned between source filter 262 and mass analyzer 270. The mass analyzer 270 includes a dipole analyzing magnet 272 and a mask 274 having a resolving aperture 276.

The scanner 220, which may be an electrostatic scanner, deflects ion beam 212 to produce a scanned ion beam having ion trajectories which diverge from a scan origin 280. The scanner 220 may comprise spaced-apart scan plates connected to the scan generator. The scan generator applies a scan voltage waveform, such as a triangular waveform, for scanning the ion beam in accordance with the electric field between the scan plates. The ion beam is typically scanned in a horizontal plane.

The angle corrector 224 is designed to deflect ions in the scanned ion beam to produce scanned ion beam having parallel ion trajectories, thus focusing the scanned ion beam. In particular, the angle corrector 224 may comprise magnetic pole pieces which are spaced-apart to define a gap and a magnet coil which is coupled to a power supply (not shown). The scanned ion beam passes through the gap between the pole pieces and is deflected in accordance with the magnetic field in the gap. The magnetic field may be adjusted by varying the current through the magnet coil.

During operation, the scanning system 216 scans the ion beam 212 across the target wafer 234 in a horizontal direction, and mechanical translation system 240 translates the platen 236 and the wafer 234 vertically with respect to scanned ion beam 230. A combination of electronic scanning of the ion beam 212 and mechanical translation of the wafer 234 causes the ion beam to be distributed over the surface of the wafer 234. As noted above, the ion beam current is measured by the Faraday cup 238 when the platen 236 is in a lowered position, and a signal representative of the ion beam current is supplied to a system controller (not shown). The electronic scan speed may be varied as a function of horizontal beam position to achieve dose uniformity.

Though FIGS. 1 and 2 depict two known implantation devices, it should be appreciated that the various systems and methods according to this disclosure may be usable with the implanters of FIGS. 1 and 2 or with any other suitable substrate processing device. Thus, the implanters of FIGS. 1 and 2 are exemplary only and should not be construed as limiting on the various embodiments of this disclosure.

As discussed above, ion implantation devices typically have at least 4 adjustable parameters: ion beam angle of incidence, ion dose, ion species and ion energy level. A fabrication "recipe" for a particular semiconductor device will consist of values for each of these parameters along with timing information for each ion implantation step in the device's "recipe." It has been observed by the inventors of this disclosure that two seemingly identical ion implanting devices may exhibit different performance characteristics in actual application. That is, although two or more implanters in a fabrication facility are running the same "recipe," and may have their adjustable parameters (angle, dose, species, energy) set to the same values, the actual values of one or more of these parameters may be different. For example, implanter may deliver a higher dose than the recipe calls for and the detection system may not read this higher dose. This type of variation is likely to results in different performance parameters of semiconductor devices processed by the inaccurate implanter as opposed to other implanters in the same fabrication facility.

The truest measurement of implanter performance is measuring the performance of the actual devices formed on the wafer. If the same "recipe" is being followed by two implanters for a making a particular semiconductor device, such as, for example, a flash memory chip, chips produced on substrate processed by the inaccurate implanter may show different parametric performance than those produced on the other implanter. A given chip should start switching at a certain threshold voltage and should switch at a particular speed. Chips produced by the aforementioned implanters may have different values for these, some of which are below acceptable variance thresholds, thereby causing dies to be wasted and yields to decrease.

Figure 3:
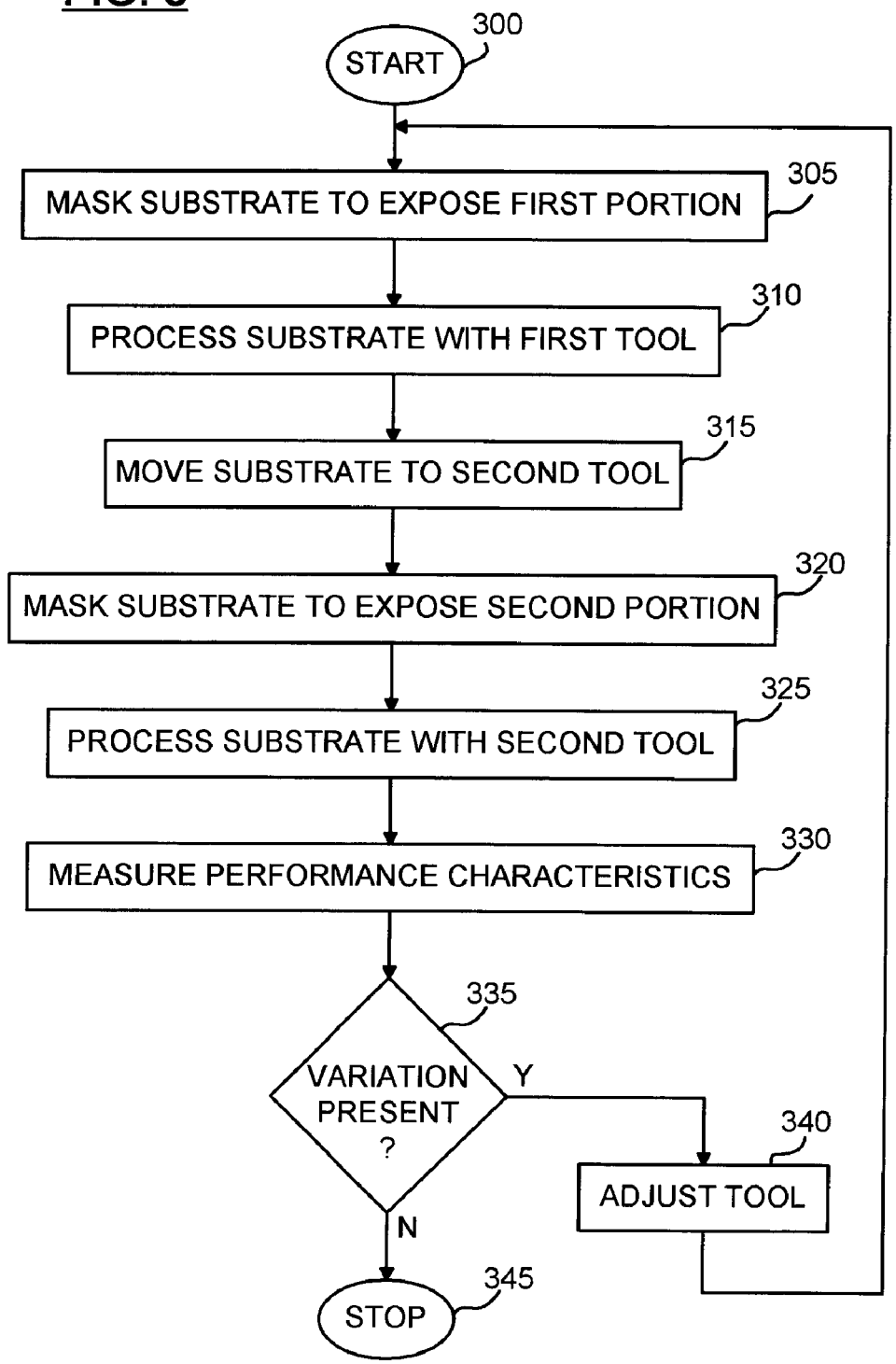
FIG. 3 is a flow chart detailing the steps of a method for reducing tool-to-tool performance variation of substrate implantation tools according to various embodiments of the present disclosure.

Referring now to FIG. 3, in this Figure, is a flow chart detailing the steps of a method for reducing tool-to-tool performance variation of substrate implantation tools according to various embodiments of the present disclosure is depicted. The method begins in step 300 and proceeds to step 305 where the target substrate is masked. In various embodiments, this will comprise applying inserting a silicone wafer into a first implanter device and masking with wafer with a masking apparatus such as that illustrated in FIG. 4 having an aperture that exposes only a portion of the wafer. In various embodiments, the wafer is clamped on a holding mechanism such as a platen, either mechanically or through electrostatic force. The mask is then positioned between the clamped wafer and the ion beam. The mask will have an opening or aperture which allows the ion beam to reach the exposed portion of the substrate surface while protecting the remainder. In various embodiments, the mask is movable between a masking position over the wafer and a non-masking position. The non-masking position may be a storage location inside or outside the process chamber of the implanter. In various embodiments, the implanter utilizes an automated mask loading and unloading mechanism. In other embodiments, the mask may be mounted in the masking position manually by an operator of the implanter. In various embodiments this will comprise performing masking according to one or more of the methods disclosed in the '761 application which has been incorporated by reference in its entirety. In various embodiments the substrate is a silicon wafer.

Figure 4:
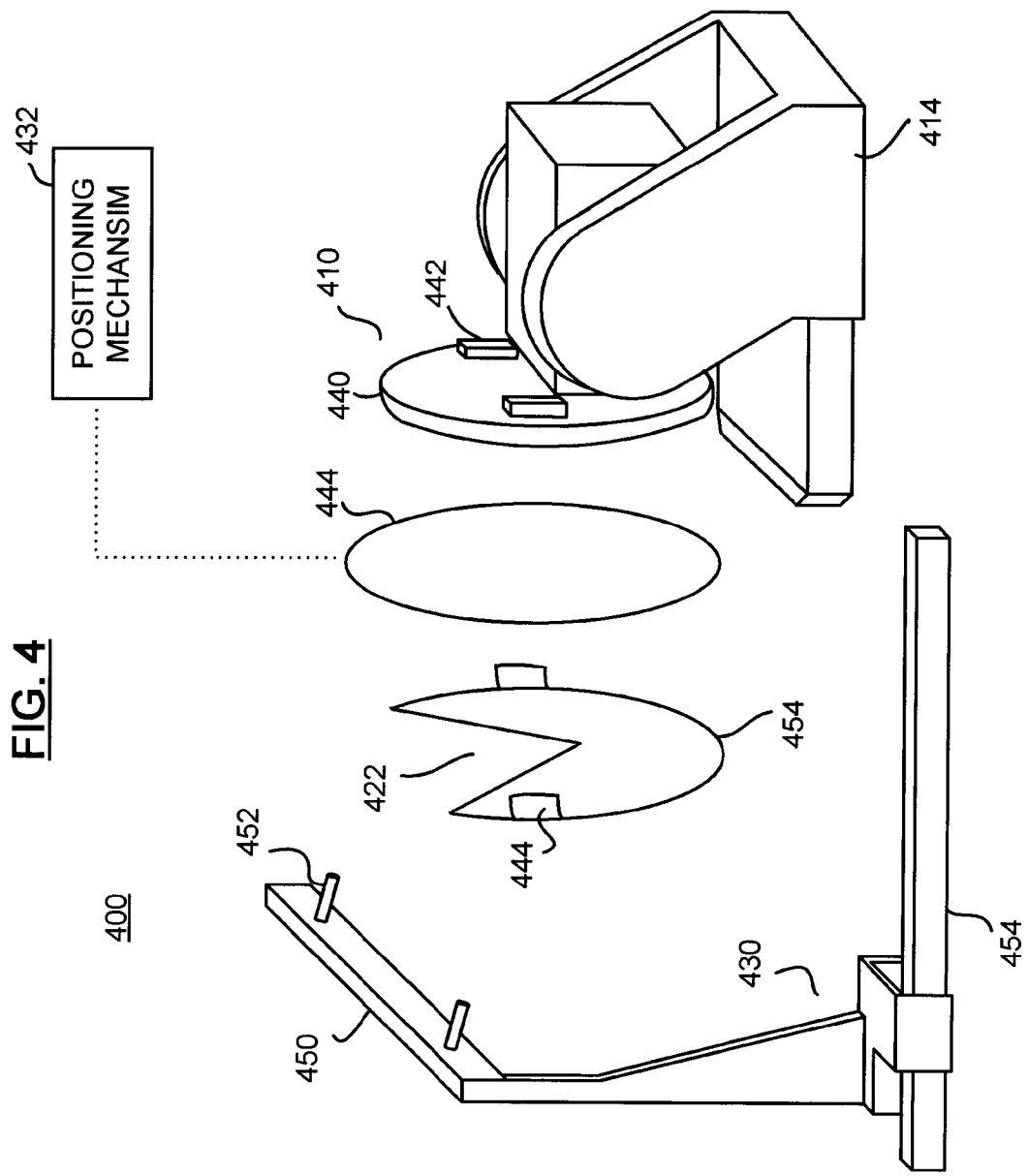
FIG. 4 is a perspective view of a substrate masking apparatus according to various embodiments of the present disclosure.

With continued reference to the flow chart of FIG. 4, after step 305, operation proceeds to step 310 where the implantation process is performed on the masked substrate using the first implanter tool. In various embodiments, the implantation process comprises an ion implantation process such as using an ion implanter. In various embodiments, the ion implantation process is performed using a plasma implanter such as that disclosed in U.S. Patent Application No. 2005/0260354, hereby incorporated by reference in its entirety. In various embodiments, the implanter may perform a normal implantation process on the substrate, that is, a sub-process of a larger device manufacturing process typically performed by the implanter. In various other embodiments, the implanter will perform a test-only process designed to demonstrate the implanter's performance under typical process conditions, but not as part of a device manufacturing process. After ion implantation is complete, the substrate is moved to a second implanter tool in step 315. In various embodiments, this may be performed using machine control, such as through a wafer drive apparatus capable of taking a substrate from one implanter tool and moving it to another implanter tool. In various other embodiments, this step requires an operator to physically remove the substrate from the first implanter to a wafer drive system of the second implanter tool. Then, in step 320, the substrate is masked with a masking apparatus. As in step 305, masking the substrate may comprise masking with one or more methods and/or apparatus' disclosed in the commonly assigned U.S. application Ser. No. 11/329,761. Next, in step 325, the substrate is implanted using the second tool. In various embodiments, this may comprise performing the same process as in step 310 with the second implanter tool on different portion of the substrate. In various embodiments, this may comprise performing a different process such as a successive or additional sub-process step in a device manufacturing process.

It should be appreciated that in various embodiments, the process described thus far may be performed without masking the substrate. For example, in ion implanters that utilize a scanning beam, that is, the beam is moved across the wafer surface, the beam's motion could be programmed to process only a portion of the wafer, thereby creating first and second processed portions. Alternatively, in implanter that move the wafer while the beam remains fixed, the wafer drive system may be programmed to move the wafer in front of the ion beam so that only a portion of the wafer is exposed to the ion beam in both the first and second implanters. It may also be possible to use a combination-type implanter that is programmed to use both beam movement and wafer movement to affect two separate processed portions on the same wafer with two implanters. Any of these methods are compatible with the various embodiments of this disclosure directed to tool-to-tool performance matching by processing different portions of the same wafer.

With continued reference to the method of FIG. 3, in step 330, after the implantation process is complete, the substrate analyzed to measure the one or more performance characteristics of the two substrate portions processed by the two implanter. In various embodiments, this comprises performing parametric testing of devices formed in the respective first and second portions by the ion implanter. Parametric testing may comprise testing for threshold voltage, required current, switching speed, etc. In various embodiments, this may comprise using a wafer probe, performing chip-level testing or material property measurements of the devices produced thereon. Alternatively, a destructive, cross-section analysis of the device can be performed to see the impact of the parameter variation, e.g., the actual location and geometry of the dopants, does levels, etc., using techniques such as scanning electron microscopy (SEM), transmission electron microscopy (TEM) and secondary ion mass spectrometry (SIMS). Various process control and testing methods and equipment are known in the field of semiconductor manufacturing. For example, in device manufacturing, one or more of the following characteristics may be measured: Ion (or Idsat)—this is the "drive current" when device is "on" (measured at the drain node); the "skew" in Ion—this is the difference in Ion in the forward and the reverse directions of the device structure; Ioff (or Isubthreshold, or Ileak)—this is the leakage current when the device is "off" (measured at the drain node); the ratio of Ion to Ioff; Vt—this is the "threshold voltage", the gate voltage at which the device is conducting significant (e.g., 1 uA) of "on" current; the "reverse bias diode leakage" measured at the drain when it is reverse biased relative to the well (substrate); Cov—this is the "overlap" capacitance between the drain & the gate—this is very sensitive to the physical overlap of the gate edge over the drain and the lateral junction abruptness of the drain structure; Cd—this is drain capacitance relative to the well—it is sensitive to the abruptness of the vertical doping profile in the drain structure; St—this is the "reverse subthreshold slope"—which is a measure of the sharpness of the turn-on characteristics of the device; and ring oscillator delay (typically in picoseconds)—this is the time delay in a ring of devices that continuously turns every device on and off in a repeating sequence—it integrates the effect of the Ion, Cov, Cd parameters into a parameter that is meaningful at the circuit level. In a preferred embodiment, parametric testing is performed, because as noted above, actual device performance is the most significant kind of validation that may be provided to a manufacturer because it shows what is produced by the tool rather that what theoretically should be.

Next, in step 335, after the performance testing is complete, a determination is made as to whether or not the two processed portions of the substrate vary in one or more identifiable parameters, thus indicating a variation in performance between the first and second implanter tools. If, in step 335 it is determined that a variation beyond an acceptable threshold exists, operation proceeds to block 340, where one or more adjustable parameters of one or both of the implanter tools is adjusted. In various embodiments, this is performed automatically. For example, in various embodiments, the testing equipment may be in communication with a controller of the first or second implanter device, thereby enabling automatic adjustment. In various other embodiments, the testing equipment will provide a message, list, print out, or other cue identifying recommended adjustment to one or more adjustable parameters of the implanter tool. In such embodiments, the adjustment will be made by a tool operator. In various embodiments, after step 340, operation will return to step 305 and continue recursively until in step 335, it is determined that no variation exists. After this condition is determined, operation proceeds to step 345 where the method stops.

It should be appreciated that the method steps outlined in the flow chart of FIG. 3, though disclosed in the context of an ion implanter, may also be applicable to reducing tool-to-tool variation in other semiconductor processing equipment including that used in deposition sub-processes, removal sub-processes, patterning sub-processes and sub-processes for performing modification of the electrical properties of substrate material.

Also, it should be appreciated that although only two implanter tools were used to process respective portions of the substrate in the example of FIG. 3, that more than two implanters may be calibrated using the various techniques disclosed herein. The number of different implanter tools that may simultaneously calibrated is limited only the number if distinct portions that can be defined on the target substrate surface while masking off the remainder so that each tool processes a different portion of the target substrate.

Referring now to FIG. 4, a perspective view of a substrate masking apparatus according to various embodiments of the present disclosure is depicted. As noted above, various embodiments of the disclosure are based on exposing only a portion of the substrate while masking off the remainder so that the same substrate may be processed with two different implanter tools. This reduces the number of wafer required from one for each implanter to only one, depending upon the number of separate areas that may be processed on a single substrate using masking.

The exemplary substrate masking apparatus 400 shown in FIG. 4 includes a platen assembly 410 to support a substrate, such as a semiconductor wafer 412 for processing, such as by an ion implanter as shown in FIGS. 1 and 2. The platen assembly 410 is supported by a scan system 414. The substrate masking apparatus 400 further includes a mask 420 having an aperture 422, a mask loading mechanism 430 and a positioning mechanism 432 to change the relative positions of the mask 420 and the wafer 412. In at least one embodiment, the positioning mechanism 432 maybe a wafer orienter that is part of a wafer drive system such as is illustrated in the embodiment shown in FIG. 1.

The platen assembly 410 of FIG. 4 includes a platen 440 having a surface for supporting the substrate wafer 412 to the platen 440. The platen assembly 410 may further include a cooling system for cooling the wafer 412 during processing and a mechanism to rotate or twist the wafer 412 about its center. In the exemplary embodiment of the FIG. 4, the platen assembly 410 also includes mask retaining elements 442. As shown, the mask 420 may be provided with fingers 444 for engaging the mask retaining elements 442.

The platen assembly system 410 is supported by the scan system 414. The scan system 414 may tilt the platen assembly 410 relative to the ion beam for angle implants and may rotate the platen assembly 410 to a substrate wafer loadunload position. In addition, the scan system 414 may translate the platen assembly 410 vertically during ion implantation.

In the embodiment depicted in FIG. 4, the mask loading mechanism 430 includes a transfer arm 450 having elements 452 for engaging the mask 420 and a drive system 454 for moving the transfer arm 450 between a load position and a storage position.

During operation of the system 400, the mask loading mechanism 430 moves the mask 420 to and from the masking position in front of the substrate wafer 412 by operation of the drive system 454. In the masking position, the mask 420 engages the mask retaining elements 442. The mask loading mechanism 430 then retracts and the scan system 414 moves the platen assembly 410 to the wafer load/unload position. The substrate wafer 412 is then loaded under the mask 420 by the wafer handling system. The wafer 412 is then ready for implantation or other processing. The wafer 412 is implanted in a first area defined by aperture 422 in mask 420. After the wafer has been implanted, it is removed by the wafer handling system. At this point, an operator may remove the wafer and insert it into a wafer handling system of another implanter tool. Alternatively, the wafer handling system may be connected to a conveyor, robot or other device capable of transporting the wafer 412 to the second implanter tool for processing similar to that described above. In the second implanter the masking position will be oriented with respect to the wafer to expose a different, unprocessed portion than that implanted by the first device.

Thus, through the various embodiments of this disclosure, tool-to-tool process variation may be efficiently identified and reduced through a less costly process than possible with conventionally methods. Also, parametric performance of device processed by different implanter on the same wafer is possible, thereby allowing manufactures to quickly identify process variation before many dies must be discarded and/or before a complete wafer scrap event occurs. By measuring actual parametric performance more precise process variation may be detected due to the sensitivity of micron and sub-micron width transistors to process variations. Thus, it is anticipated that reducing performance variation between implanter tools will reduce a fabrication facility's wastage by increasing product yield and thereby increasing profitability.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method of matching performance between semiconductor manufacturing devices comprising:
    processing a first portion of a substrate with a first device;
    moving the substrate from the first device to a second device;
    processing a second portion of the substrate with the second device;
    associating the first and second portions with the respective first and second devices; and
    comparing one or more properties of the first portion to one or more corresponding properties of the second portion.

2. The method according to claim 1, wherein processing a first portion comprises performing ion implantation on the first portion of the substrate.

3. The method according to claim 2, wherein performing ion implantation on a first portion of a silicon substrate comprises performing ion implantation on a first portion of a silicon wafer.

4. The method according to claim 2, wherein processing a first portion and a second portion of a substrate comprises applying a masking apparatus between the substrate and an ion source.

5. The method according to claim 4, wherein applying a masking apparatus comprises applying a masking apparatus having an aperture exposing the respective first and second portions while protecting the remainder of the substrate.

6. The method according to claim 2, wherein processing the respective first and second portions comprises scanning only the first and second portions of the substrate with a scanning ion beam.

7. The method according to claim 2, wherein processing the respective first and second portions comprises moving the first and second portions in front of a fixed ion beam of the respective first and second devices.

8. The method according to claim 1, wherein associating the first and second portions with the respective first and second devices comprises identifying to a data processor that the first portion was implanted using the first device and the second portion was implanted using the second device.

9. The method according to claim 8, further comprising supplying the data processor with one or more operating parameters of each of the first and second devices.

10. The method according to claim 9, wherein performing parametric testing comprises performing at least test selected from the group consisting of (1) Ion or Idsat, (2) Skew in Ion, (3) Ioff, (4) a ratio of Ion to Ioff, (5) threshold voltage Vt, (6) reverse bias diode leakage measured at the drain when it is reverse biased relative to the well, (7) Coy, (8) Cd, (9) St, (10) Ring oscillator delay, and (11) combinations of these, for each of the first and second portions and comparing the measured values.

11. The method according to claim 8, wherein comparing one or more properties of the first portion to one or more corresponding properties of the second portion comprises performing parametric testing of at least one semiconductor device formed on each of the first and second portions of the substrate.

12. The method according to claim 11, further comprising comparing the results of the parametric testing between the semiconductor devices manufactured on the first and second portions.

13. The method according to claim 12, further comprising identifying, with the data processor, at least one adjustment to an operating parameter of either the first or second device based on the comparison of the measured values.

14. The method according to claim 1, wherein moving the substrate comprises automatically moving the substrate with an automated substrate handling device.

15. The method according to claim 1, wherein moving the substrate comprises manually moving the substrate from the first device to the second device.

16. An in-situ method of matching ion implantation tool performance comprising:
    performing ion implantation on a first portion of a substrate using a first ion implanter, wherein a first mask is applied to the substrate having a first aperture exposing the first portion;
    performing ion implantation on a second portion of the substrate using a second ion implanter, wherein a second mask is applied to the substrate having a second aperture exposing the second portion;
    measuring at least one characteristic value of each of the first and second portions;
    performing a comparison of the respective characteristic values of the first and second portions; and
    determining at least one adjustment to an adjustable parameter of either the first or second implanter based on the comparison.

17. The method according to claim 16, wherein determining at least one adjustment to an adjustable parameter comprises determining at least one adjustment to a parameter selected from the group consisting of ion beam angle of incidence, ion dose, and ion energy.

18. In an semiconductor fabrication facility environment consisting of a plurality of ion implanters, a method of reducing tool-to-tool performance variation comprising: applying a first mask to a semiconductor substrate, the first mask having a first aperture exposing a first portion of the substrate; performing an ion implantation process on the substrate with a first implanter; moving the substrate to a second implanter; applying a second mask to the substrate, the second mask having an second aperture exposing a second portion of the substrate; performing an ion implantation process on the substrate with the second implanter; measuring at least one characteristic value of each of the first and second portions; comparing the measured value of each of the first and second portions; and adjusting at least one adjustable operating parameter of either the first or second implanter based on the comparison.

* * * * *

UNITED STATES PATENT AND TRADEMARK OFFICE
CERTIFICATE OF CORRECTION

PATENT NO. : 7,619,229 B2
APPLICATION NO. : 11/549790
DATED : November 17, 2009
INVENTOR(S) : Nunan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 372 days.

Signed and Sealed this

Twenty-sixth Day of October, 2010

David J. Kappos
*Director of the United States Patent and Trademark Office*